June 28, 1966 J. TARTAS 3,258,720

SELF-TUNING HARMONIC-MODE CRYSTAL OSCILLATOR CIRCUIT

Filed Sept. 9, 1963

INVENTOR.
JOSEPH TARTAS
BY
ATTORNEY

United States Patent Office 3,258,720

Patented June 28, 1966

3,258,720

SELF-TUNING HARMONIC-MODE CRYSTAL OSCILLATOR CIRCUIT

Joseph Tartas, Haskell, N.J., assignor to International Telephone and Telegraph Company, Nutley, N.J., a corporation of Maryland Filed Sept. 9, 1963, Ser. No. 307,463
4 Claims. (Cl. 331—116)

This invention relates to crystal controlled oscillator circuits and more particularly to a harmonic-mode crystal oscillator circuit which requires no tuning adjustments.

In the prior art, a grounded base Hartley oscillator normally consists of a high Q inductance and a small tuning capacitance in which the phase shift at the tap point is very critical. In most cases, the inductance is adjusted by means of a powdered iron or brass core, and the fixed tuning capacitance is solely the output capacitance of the transistor, in this case, the collector-emitter capacitance. Two highly undesirable characteristics of the normal high Q tuned circuit are frequency pulling, i.e., pulling from desired frequency to undesired frequency, i.e., beyond the tolerance limits, and jumping to a spurious mode due to the change in phase shift with tuning.

It is an object of this invention to provide a harmonic mode crystal controlled oscillator circuit that requires no tuning and has negligible phase shift over an extremely wide frequency range.

A feature of this invention is an oscillator circuit comprising a transistor having a base, an emitter and a collector, a low Q tank circuit tuned by the collector-emitter capacitance of the transistor. A crystal coupling the emitter to a tap point in the tank circuit and resistive means coupled to the tank circuit to maintain the tank circuit at a low Q value.

The above-mentioned and other feaures and objects of this invention will become more apparent by reference to the following description taken in conjunction with the accompanying drawings, in which:

FIGS. 1*a* to 1*d* are spectrum graphs of an oscillator output; and

Figure 2:
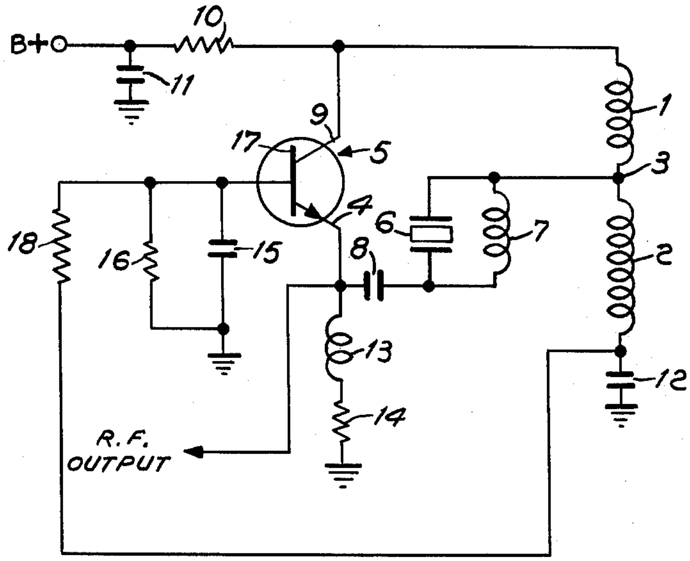

FIG. 2 is a circuit diagram of an embodiment of this invention.

Figure 1A:
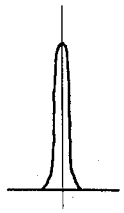
Figure 1B:
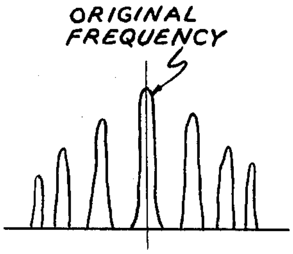
Figure 1C:
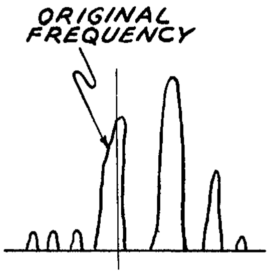
Figure 1D:
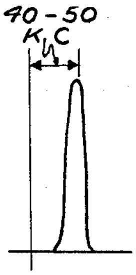

In prior art crystal controlled oscillators, some of the most serious defects occurring are "frequency pulling" and operation of the oscillator at an undesired spurious mode of the crystal caused by change in phase shift with tuning. It has been found using a spectrum analyzer that as the tuning slug of the variable inductance was tuned from minimum inductance, the initial oscillation appears first (FIG. 1*a*). Further tuning produced several sidebands separated by approximately 50 kc. intervals (FIG. 1*b*). Still further tuning produced an increase in the next sideband and a decrease in the original signal until some point was reached where the sidebands disappeared and the single signal remained at the frequency of the first sideband. The original signal had disappeared. The oscillator would then resonate at the spurious frequency and would effectively produce a second IF different from the desired IF by 40 kc. and 100 kc. Substitution of crystals produced varying results; in some cases the circuit produced the same manifestations as above described, in others either no sidebands or shift was produced or the sidebands and shift were less than the first case.

In crystal controlled oscillators, it is preferred to use series-type crystals processed to operate at an odd harmonic rather than its fundamental. The harmonic-mode crystal can oscillate at its fundamental or any of the odd harmonics (3rd, 5th, 7th), depending on which one the oscillator circuit favors. Crystals are ground to specified frqeuncies to within close frequency tolerances and are additionally tested for unwanted spurious modes. However, it has been found that crystals that have passed these tests and have been adjusted and tested in one type of oscillator circuit and used in another, the output frequency of the oscillator circuit is not necessarily the same. As described above, tunable oscillators can change the output frequency through phase shift (due to reactive tuning) over considerable range, often placing the oscillator output frequency beyond the limit of the specified tolerance of the crystal or the system. It is necessary to check the frequency of the oscillator by means of a frequency counter after substitution of a crystal to determine that the oscillator is at the correct frequency.

It has also been shown that under these conditions, if the oscillator is turned off momentarily, such as occurs during channeling or accidental shorting in the circuitry, the oscillator can start at the frequency of an unwanted mode that is most favored by the tuning of the circuit. The first condition is called "pulling" because the frequency is gradually shifted or "pulled" by the tuning of the resonant circuit and the subsequent changing of the phase of the feedback voltage. If the "pulling" is prolonged, even through the crystal may meet spurious requirements for vacuum tube circuitry, the relatively low impedance transistor circuits will allow the frequency to jump to a spurious mode of 40 to 100 kc. away. Even though the circuit is tested and adjusted in the end use equipment on a D.C. basis, there is no indication as to the frequency at which the oscillator is operating.

With reference to FIG. 2, there is shown the oscillator circuit of this invention. The basic circuit is of a grounded base Hartley configuration. The circuit comprises relatively low Q radio frequency inductors 1 and 2 in series and coupled from the junction point 3 to the emitter 4 of the transistor 5 by piezoelectric crystal 6, shunted by inductor 7 and capacitor 8 in series. The other end of inductor 1 is coupled to the collector 9 of transistor 5 and to a source of direct current voltage by resistor 10. The voltage source is coupled to ground by capacitor 11. The other end of inductor 2 is coupled to ground by capacitor 12. The emitter 4 of transistor 5 is coupled to ground by the series connection of inductor 13 and resistor 14. Inductor 13 keeps emitter 4 at a high impedance point for radio frequency, with a low direct current path to ground through stabilizing resistor 14. A capacitor 15, shunted by a resistor 16, couples the base 17 of the transistor 5 to ground. Resistor 18 couples base 17 to the connection of inductor 2 and capacitor 12.

Capacitor 15 grounds the base for RF while base bias is provided by the voltage divider consisting of resistors 16 and 18. Crystal 6 is a series resonant harmonic mode crystal, providing a low impedance path between the inductance tap point 3 and emitter 4 at the crystal frequency (fundamental or odd harmonic). Inductor 7 resonates with the crystal holder capacitance that would otherwise prevent the crystal impedance from rising at frequencies other than that controlled by the crystal. The resultant direct current path around the crystal requires the blocking capacitor 8 to block the collector supply voltage from the emitter. The oscillations at the resonant frequency are sustaianed by means of the feedback path which includes the crystal 6 and the inductance 1 and which extends from the emitter 4 to the collector 9.

The novelty of this circuit is in the components that comprise the resonant tank circuit. Normally such a circuit consists of high Q inductance and a small tuning capacitance in which the phase shift at the junction of the inductance and the capacitance is very critical. In most cases, the inductance is adjusted by means of a powdered iron or brass core, and the fixed tuning capacitance is solely the output capacitance of the transistor, in this case the collector emitter capacitance. As stated above, two highly undesirable characteristics of the normal high Q tuned circuit are frequency pulling and jumping to a spurious mode due to the change in phase shift with tuning. This novel circuit comprises the relatively low Q radio frequency inductors 1 and 2, tuned approximately by the collector-emitter capacitance and loaded by the series shunt resistor 10. The series dropping resistor 10 is in series with the collector 9 for direct current and provides a constant bias through resistors 16 and 18 relative to the collector rather than to the supply voltage. For radio frequency, resistor 10 is connected in parallel across inductors 1 and 2 through bypass capacitors 11 and 12. Since reistor 10 is approximately $\frac{1}{30}$ of the damping resistor normally used in this type of circuit, the loaded Q of this circuit is quite low. As a result, the phase shift is negligible over a wide frequency range and the crystal will operate well within its frequency tolerance over a wide frequency range.

The use of an untuned oscillator for a harmonic mode crystal is novel, since normally, untuned circuits are used only in low frequency circuits or at the crystal fundamental (usually parallel-resonant crystals). The untuned circuit of this invention not only functions over a wide range of frequencies, but automatically selects the correct mode of operation of the crystal (by proper selection of inductances 1 and 2) and maintains its frequency within the specified tolerance of the crystal (±0.005% for crystals used in DME equipment).

This oscillator has ben successfully tested with a frequency counter for crystals throughout the DME turret crystal frequency range of the tuner 42.7 to 47.9 mc. as well as for an injection oscillator circuit for a frequency converter.

It is therefore possible with this circuit to change the crystal and substitute another crystal at or near the same operating frequency without retuning the oscillator to resonant frequency.

This circuit was successfully reduced to practice with the following parameters:

Capacitors:
- 11, 12, 15 ---------- microfarads -- 1000
- 8 ---------- do ---- 39

Crystal:
- 54.5 mc.—Crystal ground so that physical characteristics are from fundamental 18 mc. to operate at 54.5 mc. (third harmonic).

Inductance:
- 1, 7 ---------- microhenry -- 1.0
- 2 ---------- do ---- 0.22

Resistors:
- 10 ---------- ohms -- 910
- 14 ---------- do ---- 100
- 16 ---------- do ---- 1000
- 18 ---------- do ---- 3900

Transistor:
- NPN ---------- 2N743
- B+ ---------- 25 v.

While I have described above the principles of my invention in connection with specific apparatus, it is to be clearly understood that this description is made only by way of example and not as a limitation to the scope of my invention as set forth in the objects thereof and in the accompanying claims.

I claim:

1. A self-tuning harmonic-mode crystal oscillator circuit comprising:
a transistor having base, emitter and collector electrodes;
a source of fixed potential;
means coupling said base electrode to ground potential;
means coupling said collector electrode to said source of fixed potential;
a low Q tank circuit coupled to said emitter and collector electrodes and being, essentially, tuned by the capacitance between said emitter and collector electrodes;
a crystal coupling said emitter electrode to a tap point in said tank circuit; and
resistive means coupled to said tank circuit to maintain said tank circuit at a low Q value.

2. A self-tuning harmonic-mode crystal oscillator circuit comprising:
a transistor having base, emitter and collector electrodes;
a piezoelectric crystal;
a tank circuit comprising first and second series coupled inductances;
means coupling said crystal to the junction of said first and second inductances;
means coupling said crystal to said emitter electrode;
means coupling said tank circuit between said emitter and collector electrodes, said tank circuit being, essentially, tuned by the capacitance between said emitter and collector electrodes;
a source of fixed potential;
resistive means coupling said source of fixed potential to said collector electrode;
capacitive means coupling said resistive means in parallel with said tank circuit at the frequency of oscillation of said oscillator circuit; and
means coupling said base electrode to ground potential.

3. The circuit of claim 2 wherein said means coupling said tank circuit comprises:
means coupling said first inductance to said collector electrode;
means coupling the junction of said series coupled inductances to said emitter electrode; and
means coupling said second inductance to ground potential.

4. A self-tuning harmonic mode crystal oscillator circuit comprising:
a transistor having a base, an emitter and a collector,
a piezoelectric crystal,
a tank circuit comprising first and second inductances series coupled,
means coupling said crystal to the junction of said first and second inductances,
a first capacitor coupling said crystal to said emitter,
a third inductance shunting said crystal,
a source of fixed potential,
first resistive means coupling said source of fixed potential to said first inductance,
a voltage divider consisting of second and third resistive means,
means coupling said second resistive means to said base and said second inductance, said third resistive means coupling said base to ground, a second capacitor coupling said second inductance to ground, a third capacitor shunting said third resistor, fourth inductance means and fourth resistor means series coupling said emitter to ground, and a fourth capacitor coupling said first resistive means in parallel with said tank circuit at the frequency of oscillation of said circuit.

References Cited by the Examiner

UNITED STATES PATENTS 3,041,550 6/1962 Goncharoff -------- 331—164 X

OTHER REFERENCES

Boyd: Journal of Institution of Electrical Engineers, "Electronic Instruments in Space-Research Vehicles," August 1959, page 458.

Buchanan, Handbook of Piezoelectric Crystals for Radio Equipment Designers, Wright Air Development Center, December 1954, pages 266–271.

Electronics, "Forty-Meter Transistor Transmitter," February 1957, pages 194, 196.

NATHAN KAUFMAN, *Primary Examiner.*

S. H. GRIMM, *Assistant Examiner.*